(12) United States Patent
Lee

(10) Patent No.: US 7,990,790 B2
(45) Date of Patent: Aug. 2, 2011

(54) WRITE DRIVER CIRCUIT OF PRAM

(75) Inventor: Joo-Ae Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 166 days.

(21) Appl. No.: 12/433,068

(22) Filed: Apr. 30, 2009

(65) Prior Publication Data

US 2010/0165717 A1   Jul. 1, 2010

(30) Foreign Application Priority Data

Dec. 26, 2008   (KR) .......................... 10-2008-0134878

(51) Int. Cl.
*G11C 29/00*   (2006.01)
(52) U.S. Cl. .................... 365/201; 365/163; 365/189.08; 365/189.16
(58) Field of Classification Search .................. 365/201, 365/189.08, 189.16, 163
See application file for complete search history.

(56) References Cited

U.S. PATENT DOCUMENTS

| | | | |
|---|---|---|---|
| 6,873,561 B2* | 3/2005 | Ooishi | 365/226 |
| 7,190,607 B2* | 3/2007 | Cho et al. | 365/148 |
| 7,224,598 B2* | 5/2007 | Perner | 365/148 |
| 7,324,371 B2* | 1/2008 | Khouri et al. | 365/163 |
| 7,325,177 B2* | 1/2008 | Tran et al. | 714/718 |
| 7,460,389 B2* | 12/2008 | Hsu et al. | 365/113 |
| 7,529,124 B2* | 5/2009 | Cho et al. | 365/163 |
| 7,573,758 B2* | 8/2009 | Park et al. | 365/189.16 |
| 7,639,527 B2* | 12/2009 | Lee et al. | 365/163 |
| 7,656,719 B2* | 2/2010 | Cho et al. | 365/189.05 |
| 7,746,688 B2* | 6/2010 | Kim et al. | 365/163 |
| 7,751,232 B2* | 7/2010 | Lee et al. | 365/163 |
| 7,830,706 B2* | 11/2010 | Hanzawa et al. | 365/163 |
| 7,848,162 B2* | 12/2010 | Kim | 365/189.16 |
| 2006/0181922 A1* | 8/2006 | Dodge et al. | 365/163 |

FOREIGN PATENT DOCUMENTS

| | | |
|---|---|---|
| KR | 1020040041678 | 5/2004 |
| KR | 100827703 | 5/2008 |

OTHER PUBLICATIONS

Notice of Allowance issued from Korean Intellectual Property Office on Nov. 29, 2010.

* cited by examiner

*Primary Examiner* — Viet Q Nguyen
(74) *Attorney, Agent, or Firm* — IP & T Group LLP

(57) ABSTRACT

A phase change random access memory (PRAM) has a function of evaluating the lifetime and reliability of a cell in a write driver circuit. The write driver circuit of the PRAM includes a normal driver configured to provide a write current for set or reset of a phase change cell connected to a bit line, a test driver configured to share a node with the normal driver, and provide an additional current for a test to the write current through the shared node in response to a test mode control signal, and a mode control unit configured to control an operation according to the test mode by providing the test mode control signal to the test driver.

20 Claims, 2 Drawing Sheets

US 7,990,790 B2

WRITE DRIVER CIRCUIT OF PRAM

CROSS-REFERENCE TO RELATED APPLICATIONS

The present invention claims priority of Korean patent application number 10-2008-0134878, filed on Dec. 26, 2008 which is incorporated by reference in its entirety.

BACKGROUND OF THE INVENTION

The present invention relates to a phase change random access memory, referred to as PRAM hereinafter, and, more particularly, to a technology for implementing a function of evaluating the lifetime and reliability of a cell in a write driver circuit of the PRAM.

Recently, a phase change random access memory (PRAM) is drawing attention as a next generation semiconductor memory and is implemented using a phase change material.

The PRAM includes a cell storing data by using a germanium antimony telluride (Ge2Sb2Te5), referred to as GST hereinafter, which is one of phase change materials. The GST as a phase change material changes to crystalline or amorphous state according to the change of temperature and the amount of current, and the PRAM stores data "0" or "1" according to the phase change.

Upon a write operation, when a current flows on the GST, the GST changes to the crystalline or amorphous state. The phase change of the GST occurs due to the Joule heating generated by a current applied to a cell.

Upon the write operation, when the GST is heated to above its melting temperature by a write current IWRITE and then is rapidly cooled, the phase of the GST changes to the amorphous state, and stores data "H" corresponding to the phase change. The amorphous state is referred to as a reset state.

Upon the write operation, when the GST is heated to above the crystallization temperature by the write current IWRITE and then is cooled after being maintained for a certain period, the phase of the GST changes to the crystalline state and stores data "L" corresponding to the phase change. The crystalline state is referred to as a set state.

FIG. 1 illustrates a typical write driver 10 of a PRAM.

The write driver 10 includes a set current source SET, a reset current source RESET, and a plurality of PMOS transistors M0, M1 and M2 controlling a write current IWRITE.

Due to the reset current source RESET, when the write current IWRITE flows through the PMOS transistor M2 in proportion to a current flowing through the reset current source RESET, a GST cell (not shown) connected to a bit line (not shown) changes to the reset state, and accordingly the PRAM stores data "H" corresponding to the reset state of the GST cell.

Due to the set current source SET, when the write current IWRITE flows through the PMOS transistor M2 in proportion to a current flowing through the set current source SET, the GST cell connected to the bit line changes to the set state, and accordingly the PRAM stores data "L" corresponding to the set state of the GST cell.

As described above, the reliability of the PRAM storing data depends on the life cycle and reliability of the GST cell. Therefore, in order to secure the reliability of the PRAM, it is necessary to evaluate the life cycle and reliability of the GST cell supplied with a write current as described above with reference to FIG. 1.

Accordingly, in order to evaluate the life cycle and reliability of the GST cell, an appropriate method of evaluating the life cycle and reliability of the GST cell by giving a stress during a short period under a severe environment such as burn-in condition is required.

SUMMARY OF THE INVENTION

Embodiments of the present invention are directed to providing a write driver circuit for evaluating the life cycle and reliability of a GST cell in a PRAM.

Embodiments of the present invention are also directed to providing a circuit using a current as an acceleration factor to evaluate the life cycle and reliability of a GST cell, and using a write current provided to a write driver circuit to give a stress to the GST cell.

In accordance with an aspect of a first embodiment of the present invention, there is provided a write driver circuit of a phase change random access memory (PRAM), including: a normal driver configured to provide a write current for set or reset of a phase change memory cell connected to a bit line; a test driver configured to share a node with the normal driver, and provide an additional current for a test to the write current through the shared node in response to a test mode control signal; and a mode control unit configured to control an operation according to the test mode by providing the test mode control signal to the test driver.

The test driver may include a driving unit configured to drive the additional current according to the operation of the normal driver; and a switching unit configured to selectively couple the driving unit to the shared node in response to the test mode control signal provided from the mode control unit. The driving unit and switching unit may include a PMOS transistor. The phase change memory cell may include comprises a germanium antimony telluride (GST) cell.

In accordance with a third embodiment of the present invention, there is provided a write driver circuit of PRAM, including: a test set current supply unit configured to provide a test set current in response to a first test mode signal; a test reset current supply unit configured to provide a test reset current in response to a second test mode signal; a driver, comprising a set current source connected in parallel to the test set current supply unit for providing a set current and the reset current source connected in parallel to the test reset current supply unit for providing a reset current, and configured to provide a write current based on the set current the reset current, the test set current and the test reset current, to a phase change memory cell connected to a bit line; and a mode control unit configured to selectively provide the first and second test mode signals to the set and reset current supply units.

The driver may include a first driving unit including: the set current source and configured to provide the set current; a second driving unit including the reset current source and configured to provide the reset current; and a third driving unit configured to drive the write current proportional to the set or reset current provided from the first driving unit or the second driving unit.

The set current supply unit may include a test set current source configured to provide the test set current, and a first switch configured to selectively couple the test set current source to the set current source in parallel in response to the first test mode.

The reset current supply unit may include a test reset current source configured to provide the test reset current; and a second switch configured to selectively couple the test reset current source to the reset current source in parallel in response to the second test mode signal. The phase change memory cell may include a GST cell.

In accordance with a fourth embodiment of the present invention, there is provided a write driver circuit of PRAM, including: a test set current supply unit configured to provide a test set current in a test mode; a test reset current supply unit configured to provide a test reset current in the test mode; and a driver comprising a set current source connected in parallel to the test set current supply unit and a reset current source connected in parallel to the test reset current supply unit, wherein the driver is configured to provide a write current by the set current source and the reset current source in the normal mode, to provide the write current by the test set current of the test set current supply unit or the test reset current of the test reset current supply unit in the test mode, and to provide the write current to a phase change cell connected to a bit line.

DESCRIPTION OF SPECIFIC EMBODIMENTS

Other objects and advantages of the present invention can be understood by the following description, and become apparent with reference to the embodiments of the present invention.

By using a current as an acceleration factor, the present invention implements a circuit for testing the reliability of a phase random access memory (PRAM), a cell of which is implemented by using a germanium antimony telluride (Ge2Sb2Te5), which will be, referred to as GST hereinafter.

That is, a write driver circuit performs a function of providing the acceleration factor for evaluating the lifetime and reliability of a GST cell by excessively providing the current to the GST cell. The evaluation of the lifetime and reliability of the GST cell may be performed under the above stress condition.

Figure 2:
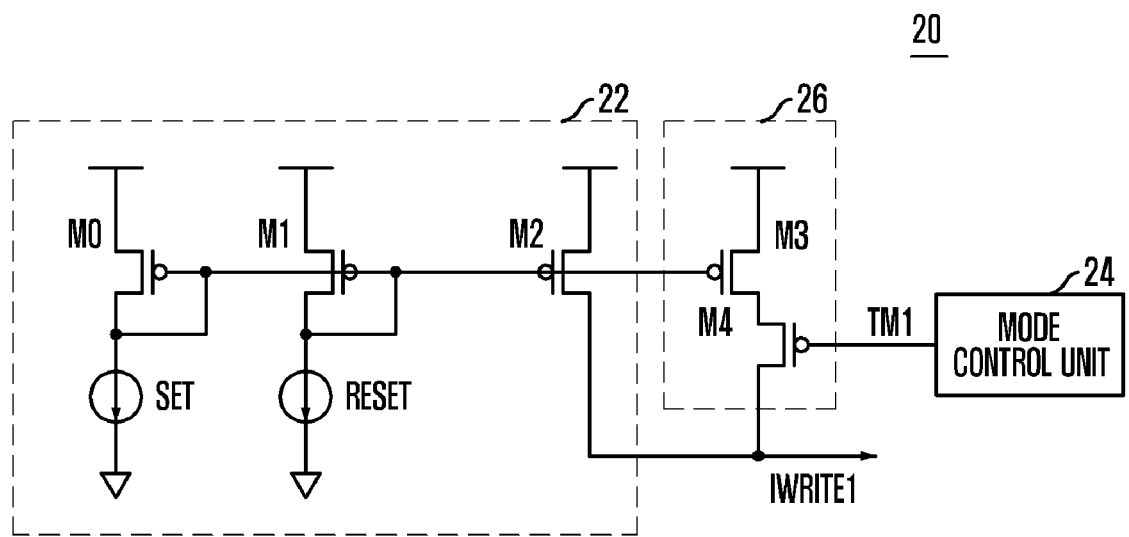
FIG. 2 is a circuit diagram illustrating a write driver circuit in accordance with an embodiment of the present invention.

Referring to FIG. 2, a write driver circuit 20 includes a normal driver 22, a test driver 26, and a mode control unit 24. The normal driver 22 and the test driver 26 output a write current IWRITE1 through a shared node. The driving of the test driver 26 is controlled by the mode control unit 24.

Specifically, the normal driver 22 includes a set current source SET, a reset current source RESET, a PMOS transistor M0, a PMOS transistor M1, and a PMOS transistor M2. The PMOS transistor M0 is connected in series to the set current source SET, and has a gate and a drain coupled to each other. The PMOS transistor M1 is connected in series to the reset current source RESET, and has a gate and a drain coupled to each other. The PMOS transistor M2 is commonly coupled to the gates of the PMOS transistors M0 and M1, and controls the output of the write current IWRITE1.

The test driver 26 includes a PMOS transistor M3 and a PMOS transistor M4, which are connected in series to each other. The gate of the PMOS transistor M3 is commonly coupled to the gates of the PMOS transistors M0 and M1. A test mode signal TM1 is applied to the gate of the PMOS transistor M4. Accordingly, since the test mode signal TM1 is applied in an activated state, the PMOS transistor M4 is turned on. In such a state, the PMOS transistor M3 supplies an additional test current to the write current IWRITE1.

Figure 1:
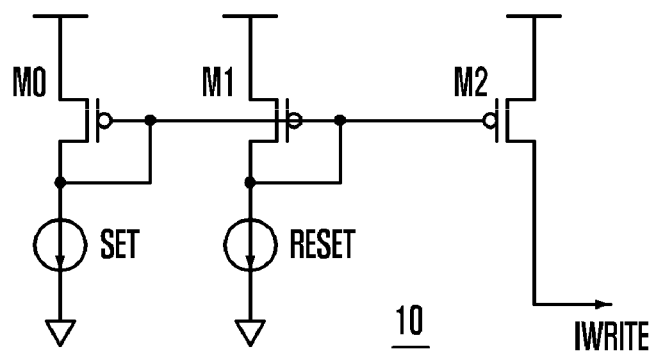
FIG. 1 is a circuit diagram illustrating a write driver circuit of a conventional PRAM.

That is, in a normal mode where the test mode signal TM1 is in deactivated state, the write current IWRITE1 is outputted at the same level as the write current IWRITE provided in FIG. 1.

However, in a test mode where the test mode signal TM is in an activated state, the current IWRITE1 is increased as much as a current (a) provided from the PMOS transistor M3, compared to the normal mode. Accordingly, the write current IWRITE1 of the write driver circuit illustrated in FIG. 2 is a sum of the write current IWRITE provided in the typical write driver circuit and the current (a) provided from the PMOS transistor M3. That is, the relation between the write current IWRITE and the current (a) may be expressed by the following Equation 1:

$$IWRITE1=IWRITE+(a) \qquad \text{Eq. 1}$$

The test mode may be performed using the write current IWRITE1 having a large current for test. In the test mode, an evaluation of the GST cell may be performed through an application of a stress by the write current IWRITE1.

On the other hand, the mode control unit 24 may output the test mode signal TM1 of the activated state when a mode of providing a write current for the test of the GST cell is performed. Also, the mode control unit 24 may output the test mode signal TM1 of the deactivated state when a mode of providing a normal write current to the GST cell is performed.

As described above, the embodiment of FIG. 2 illustrates a test driver connected in parallel to the output node of the write current.

Unlike the embodiment of FIG. 2, a write driver circuit 30 in accordance with another embodiment of the present invention may be configured to provide a write current for the test by separately including a current source applied according to the normal mode and a current source additionally applied according to the test mode.

Figure 3:
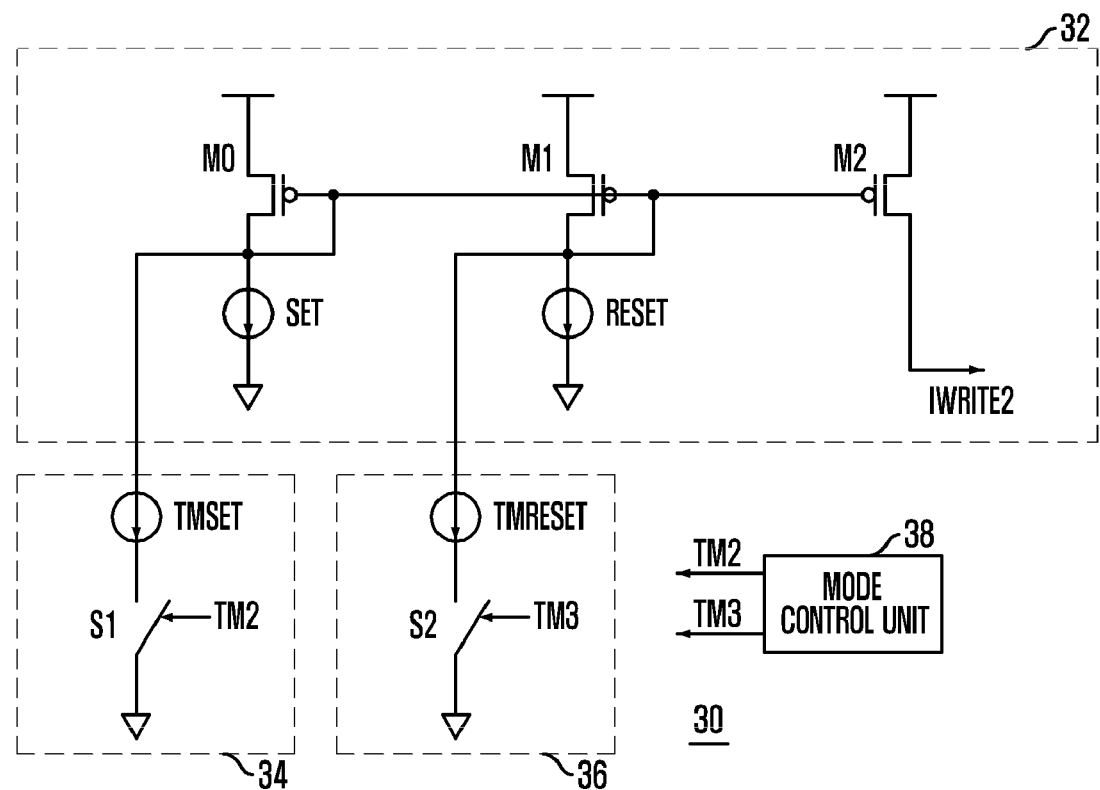
FIG. 3 is a circuit diagram illustrating a write driver circuit in accordance with another embodiment of the present invention.

Such an embodiment is illustrated in FIG. 3. The write driver circuit 30 includes a driver 32, a test set current supply unit 34, a test reset current supply unit 36, and a mode control unit 38.

Since the configuration of the driver 32 is identical to that of the normal driver 22, descriptions of the same configuration and operation will be omitted.

The test set current supply unit 34 is connected to a node between a PMOS transistor M0 and a set current source SET, and the test reset current supply unit 36 is connected to a node between a PMOS transistor M1 and a reset current source RESET. That is, the test set current supply unit 34 is connected in parallel to the set current source SET, and the test reset current supply unit 36 is connected in parallel to the reset current source RESET.

The test set current supply unit 34 includes a test set current source TMSET and a switch S1 connected in series to each other. The switch S1 is turned on/off by a test mode signal TM2 provided from the mode control unit 38.

The test reset current supply unit 36 includes a test reset current source TMRESET and a switch S2 connected in series to each other. The switch S2 is turned on/off by a test mode signal TM3 provided from the mode control unit 38.

The mode control unit 38 respectively provides the test mode signals TM2 and TM3 to the test set current supply units 34 and 36. When a test mode is not performed, both of the test mode signals TM2 and TM3 are maintained in the deactivated state. In this case, in order to perform a test set, the test mode signal TM2 changes to the activated state, and in order to perform a test reset, the test mode signal TM3 changes to activated state.

In a normal mode, the driver 32 provides the same write current as in FIG. 1 since an additional current is not supplied through the test set current supply unit 34 or the test reset current supply unit 36.

In a test mode, when a write current IWRITE2 flows through a PMOS transistor M2 in proportion to a current provided by the reset current source RESET and test reset current source TMRESET, a GST cell (not shown) connected to a bit line (not shown) is tested by receiving a stress due to the write current IWRITE2 of the test mode.

In a test mode, when a write current IWRITE2 flows through a PMOS transistor M2 in proportion to a current provided by the set current source SET and test set current source TMSET, the GST cell connected to a bit line is tested by receiving a stress due to the write current IWRITE2 of the test mode.

In accordance with embodiments of the present invention, by using a current as an acceleration factor, it is possible to evaluate the life cycle and reliability of the GST cell by giving a stress due to a current provided from a write driver circuit during a short period under a severe environment such as burn-in condition.

Also, it is possible to evaluate the GST cell by providing a current for evaluating the life cycle and reliability of the GST cell using a write driver circuit.

While the present invention has been described with respect to the specific embodiments, it will be apparent to those skilled in the art that various changes and modifications may be made without departing from the spirit and scope of the invention as defined in the following claims.

What is claimed is:

1. A write driver circuit of a phase change random access memory (PRAM), comprising:
    a normal driver configured to provide a write current for set or reset of a phase change memory cell connected to a bit line;
    a test driver configured to share a node with the normal driver, and provide an additional current for a test to the write current through the shared node in response to a test mode control signal; and
    a mode control unit configured to control an operation according to the test mode by providing the test mode control signal to the test driver.

2. The write driver circuit of claim 1, wherein the test driver comprises:
    a driving unit configured to drive the additional current according to the operation of the normal driver; and
    a switching unit configured to selectively couple the driving unit to the shared node in response to the test mode control signal provided from the mode control unit.

3. The write driver circuit of claim 2, wherein the driving unit comprises a PMOS transistor.

4. The write driver circuit of claim 2, wherein the switching unit comprises a PMOS transistor.

5. The write driver circuit of claim 1, wherein the phase change memory cell comprises a germanium antimony telluride (GST) cell.

6. A write driver circuit of a phase change random access memory (PRAM), comprising:
    a set current driving unit comprising a set current source and configured to provide a set current;
    a reset current driving unit comprising a reset current source and configured to provide a reset current;
    a driving unit configured to provide a write current proportional to the set current or the reset current to a phase change memory cell connected to a bit line; and
    a test driver enabled in a test mode to provide an additional current to the write current.

7. The write driver circuit of claim 6, wherein the test driver comprises:
    a second driving unit configured to drive the additional current in communication with the first driving unit; and
    a switching unit configured to provide the additional current to the write current in the test mode.

8. The write driver circuit of claim 7, wherein the second driving unit comprises a PMOS transistor.

9. The write driver circuit of claim 7, wherein the switching unit comprises a PMOS transistor.

10. The write driver circuit of claim 6, wherein the phase change memory cell comprises a germanium antimony telluride (GST) cell.

11. A write driver circuit of a phase change random access memory (PRAM), comprising:
    a test set current supply unit configured to provide a test set current in response to a first test mode signal;
    a test reset current supply unit configured to provide a test reset current in response to a second test mode signal;
    a driver, comprising a set current source connected in parallel to the test set current supply unit for providing a set current and a reset current source connected in parallel to the test reset current supply unit for providing a reset current, and configured to provide a write current based on the set current, the reset current, the test set current and the test reset current, to a phase change memory cell connected to a bit line; and
    a mode control unit configured to selectively provide the first and second test mode signals to the set and reset current supply units.

12. The write driver circuit of claim 11, wherein the driver comprises:
    a first driving unit comprising the set current source and configured to provide the set current;
    a second driving unit comprising the reset current source and configured to provide the reset current; and
    a third driving unit configured to drive the write current proportional to the set or reset current provided from the first driving unit or the second driving unit.

13. The write driver circuit of claim 11, wherein the test set current supply unit comprises:
    a test set current source configured to provide the test set current; and
    a first switch configured to selectively couple the test set current source to the set current source in parallel in response to the first test mode.

14. The write driver circuit of claim 11, wherein the reset current supply unit comprises:
    a test reset current source configured to provide the test reset current; and
    a second switch configured to selectively couple the test reset current source to the reset current source in parallel in response to the second test mode signal.

15. The write driver circuit of claim 11, wherein the phase change memory cell comprises a GST cell.

16. A write driver circuit of PRAM, comprising:
    a test set current supply unit configured to provide a test set current in a test mode;
    a test reset current supply unit configured to provide a test reset current in the test mode; and
    a driver comprising a set current source connected in parallel to the test set current supply unit and a reset current source connected in parallel to the test reset current supply unit, wherein the driver is configured to provide a write current based on the set current source and the reset current source in the normal mode, to provide the write current based on the test set current of the test set current supply unit or the test reset current of the test reset current supply unit in the test mode, and to provide the write current to a phase change memory cell connected to a bit line.

17. The write driver circuit of claim 16, wherein the driver comprises:
   a first driving unit comprising the set current source and configured to provide a set current;
   a second driving unit comprising the reset current source and configured to provide a reset current; and
   a third driving unit configured to drive the write current proportional to the set or reset current provided from the first driving unit or the second driving unit.

18. The write driver circuit of claim 16, wherein the set current supply unit comprises:
   a test set current source configured to provide the test set current; and
   a first switch configured to selectively couple the test set current source to the set current source in parallel in response to a first test mode signal.

19. The write driver circuit of claim 16, wherein the reset current supply unit comprises:
   a test reset current source configured to provide the test rest current; and
   a second switch configured to selectively couple the test reset current source to the reset current source in response to a second test mode signal.

20. The write driver circuit of claim 16, wherein the phase change memory cell comprises a GST cell.

* * * * *